United States Patent
Yoshida et al.

[11] Patent Number: 6,163,101
[45] Date of Patent: Dec. 19, 2000

[54] PIEZOELECTRIC RESONATOR

[75] Inventors: Ryuhei Yoshida, Toyama; Nobuhiro Kitajima, Toyama-ken; Kenichi Sakai, Toyama, all of Japan

[73] Assignee: Murata Manufacturing Co., Ltd., Japan

[21] Appl. No.: 09/299,492

[22] Filed: Apr. 26, 1999

[30] Foreign Application Priority Data

Jun. 2, 1998 [JP] Japan ................... 10-153239

[51] Int. Cl.[7] .................................. H03H 9/17
[52] U.S. Cl. ................... 310/348; 310/320; 310/344
[58] Field of Search .................... 310/320, 344, 310/348

[56] References Cited

U.S. PATENT DOCUMENTS

| 4,633,124 | 12/1986 | Kawashima | 310/348 |
| 5,184,043 | 2/1993 | Yoshinaga | 310/320 |
| 5,589,724 | 12/1996 | Satoh et al. | 310/348 |
| 5,839,178 | 11/1998 | Yoshida et al. | 310/348 |

FOREIGN PATENT DOCUMENTS 7-70941  7/1995  Japan .................... 310/320

*Primary Examiner*—Thomas M. Dougherty
*Attorney, Agent, or Firm*—Keating & Bennett, LLP

[57] ABSTRACT

A piezoelectric resonator includes two sealing substrates, a seal portion, and an energy-trap type piezoelectric resonance element which is adapted to vibrate in a third harmonic of thickness extensional vibration. The piezoelectric resonance element includes a piezoelectric substrate and a pair of excitation electrodes, which are disposed on opposite major surfaces of the piezoelectric substrate. A portion of the piezoelectric substrate sandwiched by the excitation electrodes defines a vibrating portion. The sealing substrates each have a cavity formed therein and are attached onto the corresponding major surfaces of the piezoelectric substrate such that the cavities define a space for vibration. The seal portion is formed around the vibration space so as to damp leaking vibration. The vibrating portion is arranged such that the approximate center thereof is spaced from the approximate center of the vibration space as viewed along the major surfaces of the piezoelectric resonance element.

20 Claims, 11 Drawing Sheets

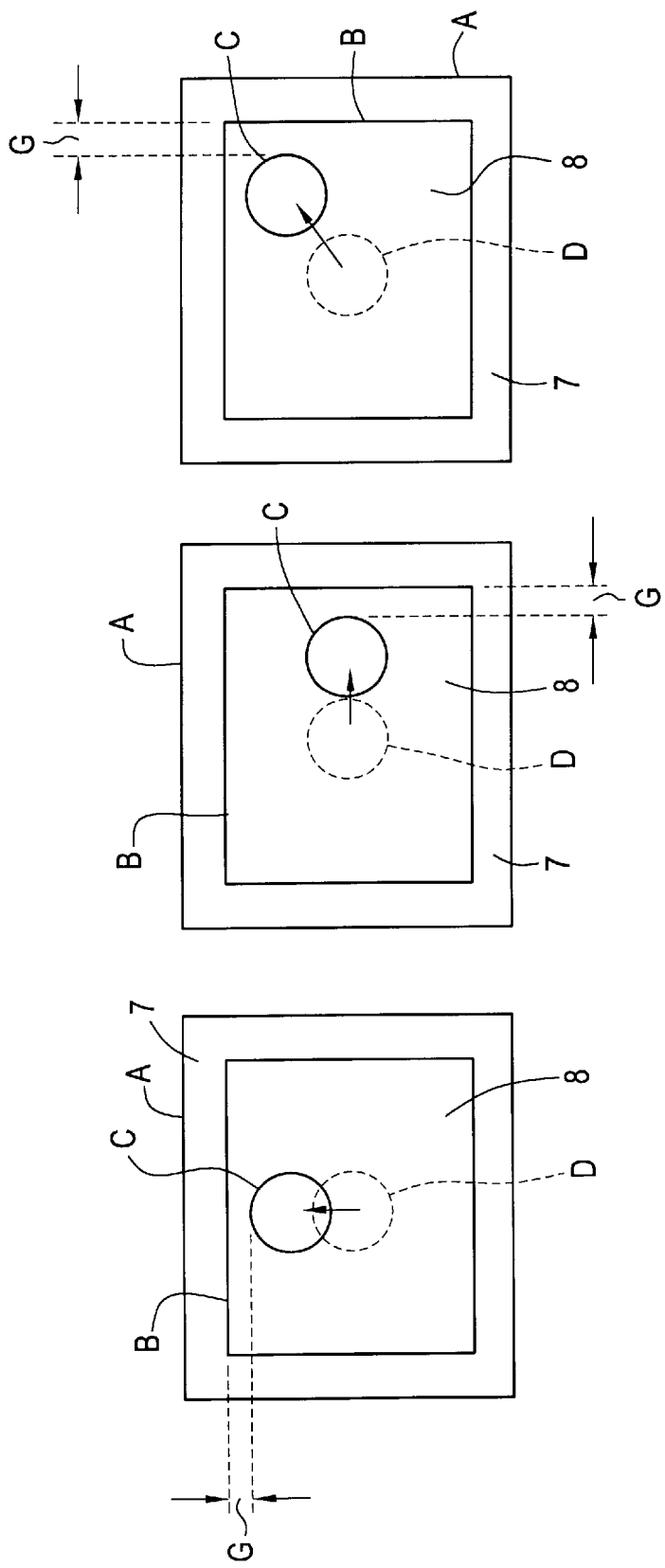

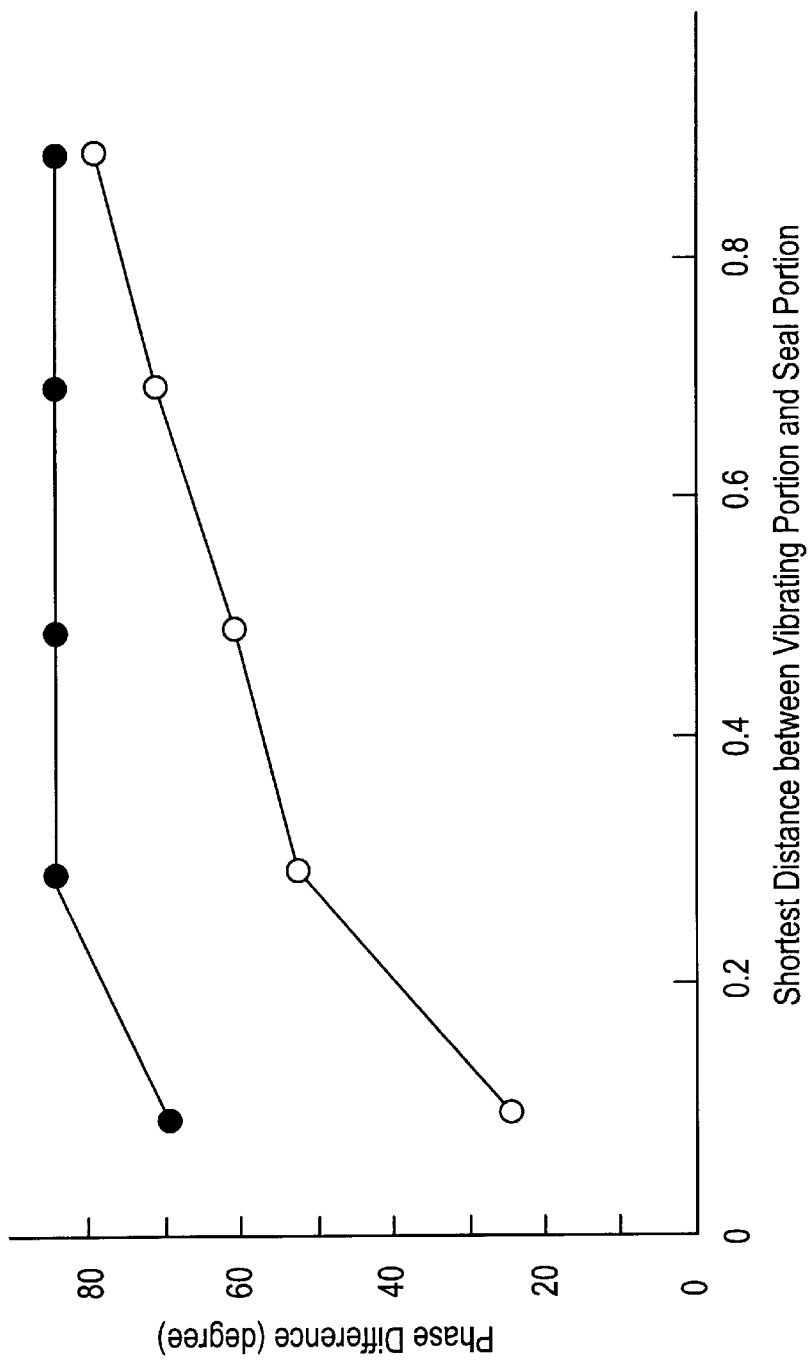

FIG. 9
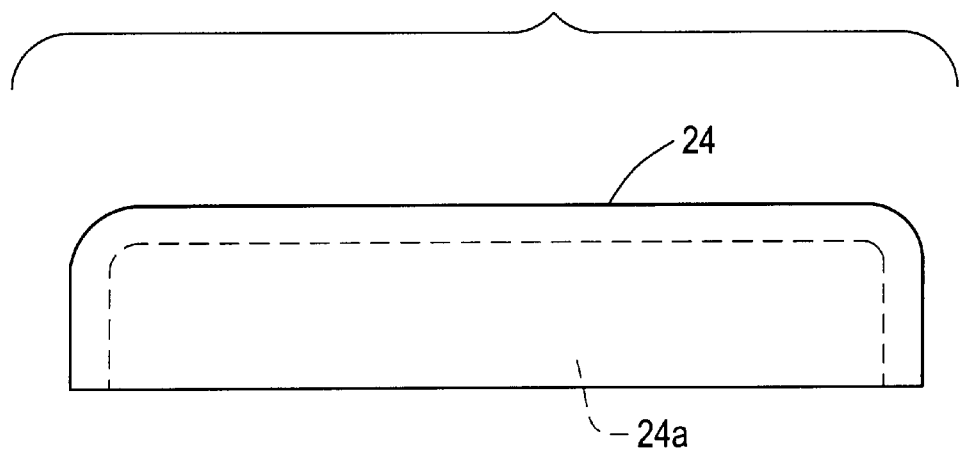
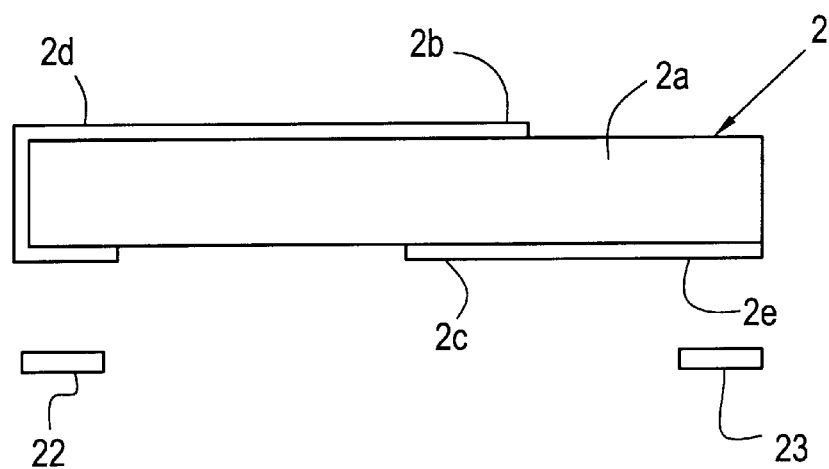
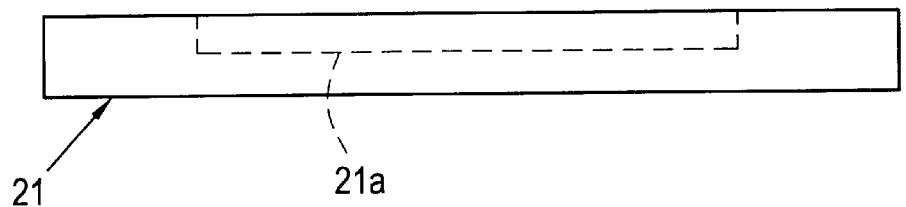

FIG. 10
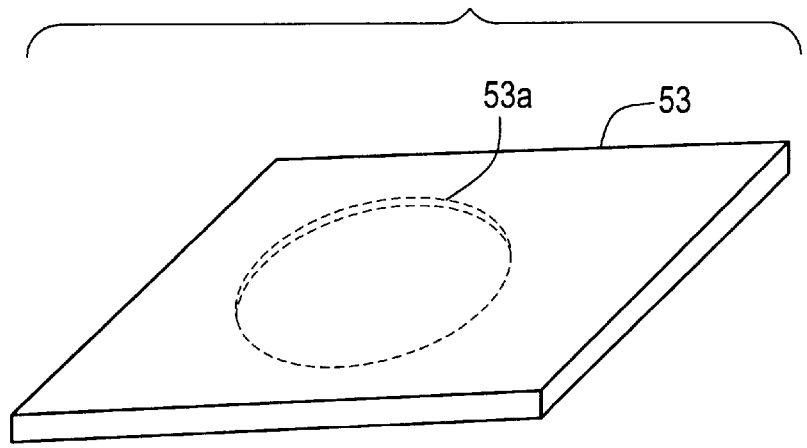
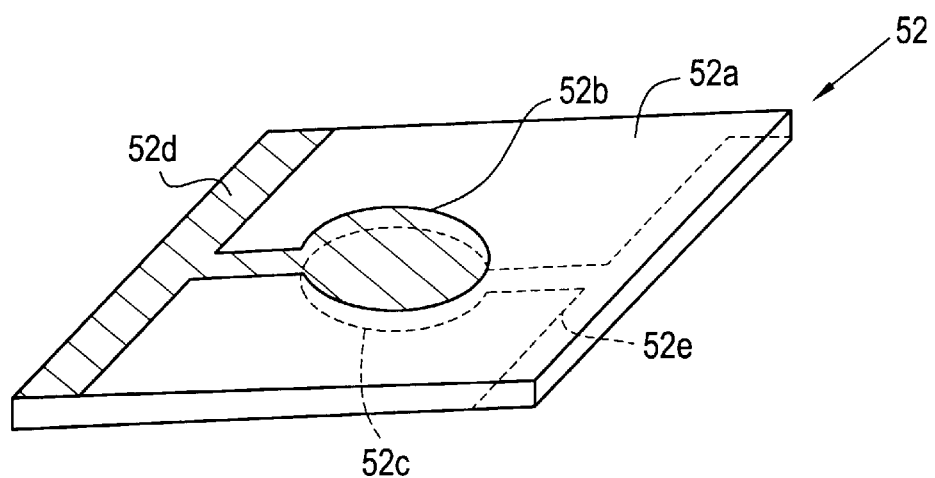
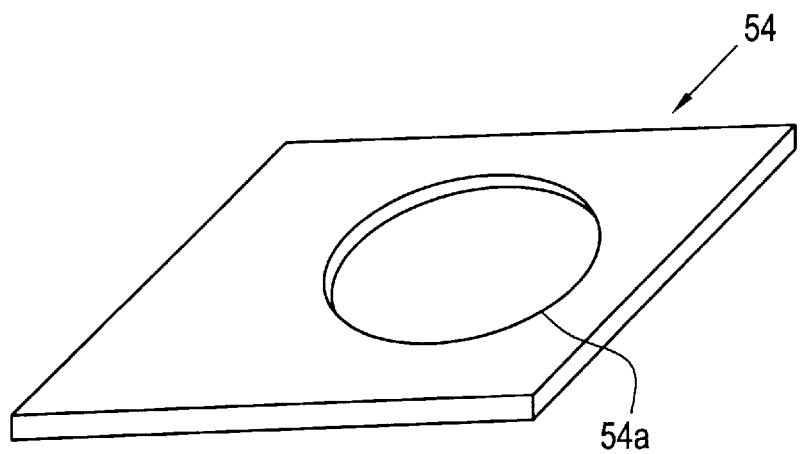

PIEZOELECTRIC RESONATOR

BACKGROUND OF THE INVENTION

1. Field of the Invention

The present invention relates to a piezoelectric resonator used in, for example, a trap circuit or a discriminator, and more particularly, to an energy-trap type piezoelectric resonator which includes a piezoelectric resonance element and a package having a space for allowing vibration of a vibrating portion of the piezoelectric resonance element.

2. Description of the Related Art

Japanese Patent Publication (kokoku) No. 7-70941 discloses a piezoelectric resonator including an energy trap type piezoelectric resonance element which utilizes a thickness extensional vibration mode. The structure of the piezoelectric resonator will next be described with reference to FIGS. 10 and 11.

FIG. 10 is an exploded perspective view of the piezoelectric resonator. FIG. 11 is a vertical sectional view of the piezoelectric resonator of FIG. 10.

A piezoelectric resonator 51 includes an energy trap type piezoelectric resonance element 52 which utilizes a thickness extensional vibration mode. The piezoelectric resonance element 52 includes a rectangular piezoelectric substrate 52a. A first excitation electrode 52b is disposed on the upper surface of the piezoelectric substrate 52a at the center thereof. A second excitation electrode 52c is disposed on the lower surface of the piezoelectric substrate 52a at the center thereof, so that the excitation electrodes 52b and 52c face each other with the piezoelectric substrate 52a disposed therebetween.

The excitation electrodes 52b and 52c are connected with lead electrodes 52d and 52e, respectively. A lead electrode 52d extends along the upper surface of the piezoelectric substrate 52a to one side edge thereof. The lead electrode 52e extends along the lower surface of the piezoelectric substrate 52a to the side edge of the substrate 52a opposite to the side edge to which the lead electrode 52d extends.

Sealing substrates 53 and 54 are attached onto the upper and lower surfaces, respectively, of the piezoelectric resonance element 52. Each of the sealing substrates 53 and 54 is made of an insulating ceramic, such as alumina, and has a rectangular block shape. A cavity 53a is formed in the lower surface of the sealing substrate 53, and a cavity 54a is formed in the upper surface of the sealing substrate 54. The cavities 53a and 54a are arranged so as to be displaced relative to each other when the sealing substrates 53 and 54 are placed on the piezoelectric resonance element 52.

In the piezoelectric resonator 51, the sealing substrates 53 and 54 are bonded to the piezoelectric substrate 52a via an insulating adhesive layer.

A portion of the piezoelectric resonance element 52 sandwiched between the first and second excitation electrodes 52b and 52c functions as a vibrating portion. As shown in FIG. 11, since the vibrating portion is disposed within the cavities 53a and 54a, the vibrating portion, when excited, can freely vibrate within the space defined by the cavities 53a and 54a.

Reference numerals 55 and 56 denote external electrodes. The external electrode 55 is electrically connected to the lead electrode 52d, and the external electrode 56 is electrically connected to the lead electrode 52e.

In the piezoelectric resonator 51, leakage vibration of the fundamental harmonic excited at the vibrating portion is damped at a bonded portion between the piezoelectric resonance element 52 and the sealing substrates 53 and 54. For example, at a portion where the sealing substrate 53 and the upper surface of the piezoelectric resonance element 52 are bonded via an insulating adhesive layer (not shown), leakage vibration of the fundamental harmonic is damped. Through adjustment of the amount of deviation between the cavities 53a and 54a, the amount of damping of leakage vibration of the fundamental harmonic can be adjusted, thereby obtaining a desired frequency characteristic.

Recently, in an effort to increase the operating frequency using a structure similar to that of the piezoelectric resonator 51, the third harmonic has been utilized. In a piezoelectric resonator which utilizes the third harmonic, the fundamental harmonic and fifth and higher odd harmonics become spurious vibration. Accordingly, unless the fundamental harmonic is reliably damped, utilization of the third harmonic may fail, potentially resulting in anomalous oscillation. Since the gain of an IC tends to decrease with frequency, the fundamental harmonic having the lowest frequency easily satisfies the oscillation conditions, so that the fundamental harmonic is highly likely to cause anomalous oscillation. Therefore, reliable damping of the fundamental harmonic has been highly demanded.

In order to suppress the fundamental harmonic without affecting the third harmonic, damping may be effected at a region outside of the vibrating portion, to which region the fundamental harmonic leaks. The region where the fundamental harmonic leaks move, depending on the diameter of the excitation electrodes 52b and 52c, is in concentric regions with respect to the centers of the excitation electrodes. Accordingly, the sizes of the cavities 53a and 54a need to be modified according to the diameter of the excitation electrodes 52b and 52c.

In a piezoelectric resonator in which a space adapted to ensure vibration of a vibrating portion thereof is formed within a package, the fundamental harmonic may be suppressed by either of the following methods: (1) the size of the space is modified according to the diameter of excitation electrodes in order to ensure the vibration; and (2) as in the case of the piezoelectric resonator 51, the upper and lower cavities 53a and 54a are displaced relative to each other.

However, method (1), in which the size of the space is modified according to the electrode diameter, requires a variety of sealing substrates having cavities of different diameters. Thus, not only are expensive dies required, but also the manufacturing processes become complicated, resulting in an increase in manufacturing cost.

In method (2), in which the cavities 53a and 54a are displaced relative to each other, even when the displacement is established by machining dies or by polishing end surfaces of the sealing substrates, use of a variety of sealing substrates is still involved. Thus, not only are relatively expensive dies involved, but also the manufacturing processes become complicated, resulting in an increase in manufacturing cost.

Further, when the end surfaces of the sealing substrates are polished after formation of the cavities in order to establish the relative displacement between the cavities, the relative displacement cannot be accurately controlled, since the quality and workmanship of the polishing determines the accuracy of the relative displacement.

SUMMARY OF THE INVENTION

To overcome the problems described above, preferred embodiments of the present invention provide a piezoelectric resonator which includes an energy trap type piezoelectric resonance element utilizing the third harmonic of a thickness extensional vibration mode, which is constructed to damp the fundamental harmonic easily and reliably, and which does not require an increase in the number of package materials of different types to be used, thereby providing a low manufacturing cost.

According to a preferred embodiment of the present invention, a piezoelectric resonator includes a packaging member, a seal portion, and an energy trap type piezoelectric resonance element which is adapted to vibrate the third harmonic of thickness extensional vibration. The piezoelectric resonance element includes a piezoelectric substrate and a pair of excitation electrodes, which are provided on opposite major surfaces of the piezoelectric substrate so as to face each other with the piezoelectric substrate disposed therebetween. A portion of the piezoelectric substrate sandwiched by the excitation electrodes defines a vibrating portion. The packaging member is arranged to define a space which encloses at least the vibrating portion so as to allow for vibration of the vibrating portion. The seal portion is provided around the space so as to damp leaking vibration. The vibrating portion is arranged such that the center thereof is displaced from the center of the space as viewed along the major surface of the piezoelectric resonance element.

As a result of this unique arrangement and structure, leakage vibration of the fundamental harmonic, which might otherwise cause significant spurious vibration, is effectively suppressed without causing much effect on a resonance characteristic produced by the third harmonic of the thickness extensional vibration.

Therefore, undesirable spurious vibrations caused by the fundamental harmonic are suppressed effectively. For example, when the piezoelectric resonator according to preferred embodiments of the present invention is used as a piezoelectric oscillator, anomalous oscillation is prevented.

Further, since the above-described effect is achieved by forming the vibrating portion such that the center thereof is displaced from the center of the vibration space, the packaging member for defining the vibration space is not required to be specially designed. Therefore, the cost of dies for forming a cavity which defines the vibration space is greatly reduced, and the manufacturing process is greatly simplified.

Thus, there can be provided an energy trap type piezoelectric resonator which utilizes the third harmonic of thickness extensional vibration, provides an excellent resonance characteristic, and is constructed so as to be manufactured at low cost.

The packaging member may include first and second sealing substrates attached onto the corresponding major surfaces of the piezoelectric resonance element. Each of the first and second sealing substrates has a cavity provided on the side thereof in contact with the piezoelectric resonance element. The cavities define the vibration space. Each of the first and second sealing substrates is bonded to the piezoelectric resonance element at a portion surrounding the cavity. The bonded portions serve as the seal portion.

In this case, the displacement of the vibrating portion may be implemented through control of the position of the excitation electrodes on the piezoelectric resonance element, indicating that the cavities formed in the first and second sealing substrates may not be displaced relative to each other. Therefore, the first and second sealing substrates can be made of substrates of a single type.

The packaging member may include a base substrate and a capping member. The piezoelectric resonance element is bonded to a top surface of the base substrate such that vibration thereof is not hindered. The capping member has an opening that faces downward and is bonded to the base substrate via a circumferential edge of the opening. The portion through which the piezoelectric resonance element is bonded to the base substrate defines the seal portion. In this case, even in a package structure using the cap, the vibrating portion can be displaced from the center of the vibration space through control of the position of the excitation electrodes on the piezoelectric resonance element, indicating that the base substrate and the cap do not have to be of special design. Therefore, the cost of manufacturing the packaging member can be greatly reduced, and the manufacturing process can be simplified.

When the thickness of the piezoelectric resonance element is represented by t, and the shortest distance between the vibrating portion and the seal portion is represented by G, t and G are preferably determined so as to satisfy the relation "$0 < G/t \leq 5$."

In this case, spurious vibration due to leakage of the fundamental harmonic can be more effectively suppressed. Thus, there can be provided a piezoelectric resonator utilizing the third harmonic of thickness extensional vibration and exhibiting excellent resonance characteristics.

The center of the vibration space may be aligned with that of the piezoelectric resonance element as viewed along the major surface of the piezoelectric resonance element.

In this case, the packaging member having the cavity for defining the vibration space formed therein can be easily manufactured, so that the cost of manufacturing the piezoelectric resonator can be further reduced.

Alternatively, the center of the vibration space may be displaced from that of the piezoelectric resonance element as viewed along the major surface of the piezoelectric resonance element.

In this case, even when the vibrating portion is located at the center of the piezoelectric resonance element as viewed along the major surface of the element, the vibrating portion is displaced from the center of the space as viewed along the major surface of the element. Thus, a piezoelectric resonance element having excitation electrodes disposed at the center thereof can be used in the present invention, so that the cost of manufacturing the piezoelectric resonator can be further reduced.

The seal portion may be formed of an adhesive layer. In this case, the seal portion can be easily formed simply by bonding the piezoelectric resonance element to the packaging member, such as the sealing substrate.

Preferred embodiments of the present invention also provide a method of damping the fundamental harmonic of a thickness extensional vibration generated by the above described piezoelectric resonator. The method includes the step of displacing the center of the vibrating portion from the center of the vibration space as viewed along the major surface of the piezoelectric resonance element.

Other features and advantages of the present invention will become apparent from the following description of the invention which refers to the accompanying drawings.

BRIEF DESCRIPTION OF THE DRAWINGS

FIG. 3A is a plan view showing the positional relation among a seal portion, a space, and a vibrating portion in an modified example of the piezoelectric resonator of FIG. 1;

FIG. 3B is a plan view showing the positional relation among the seal portion, the space, and the vibrating portion in another modified example of the piezoelectric resonator of FIG. 1;

FIG. 3C is a plan view showing the positional relation among the seal portion, the space, and the vibrating portion in a further modified example of the piezoelectric resonator of FIG. 1;

FIG. 7 is a graph showing the shortest distance G between the vibrating portion and the seal portion vs. the phase difference between the fundamental harmonic of thickness extensional vibration and the third harmonic of the fundamental harmonic in the piezoelectric resonator of FIG. 1;

FIG. 9 is an exploded view showing a still further modified example of the present invention, in which a package includes a base substrate and a capping member;

FIG. 10 is an exploded perspective view of an existing chip-type piezoelectric resonator.

DETAILED DESCRIPTION OF PREFERRED EMBODIMENTS

Figure 1:
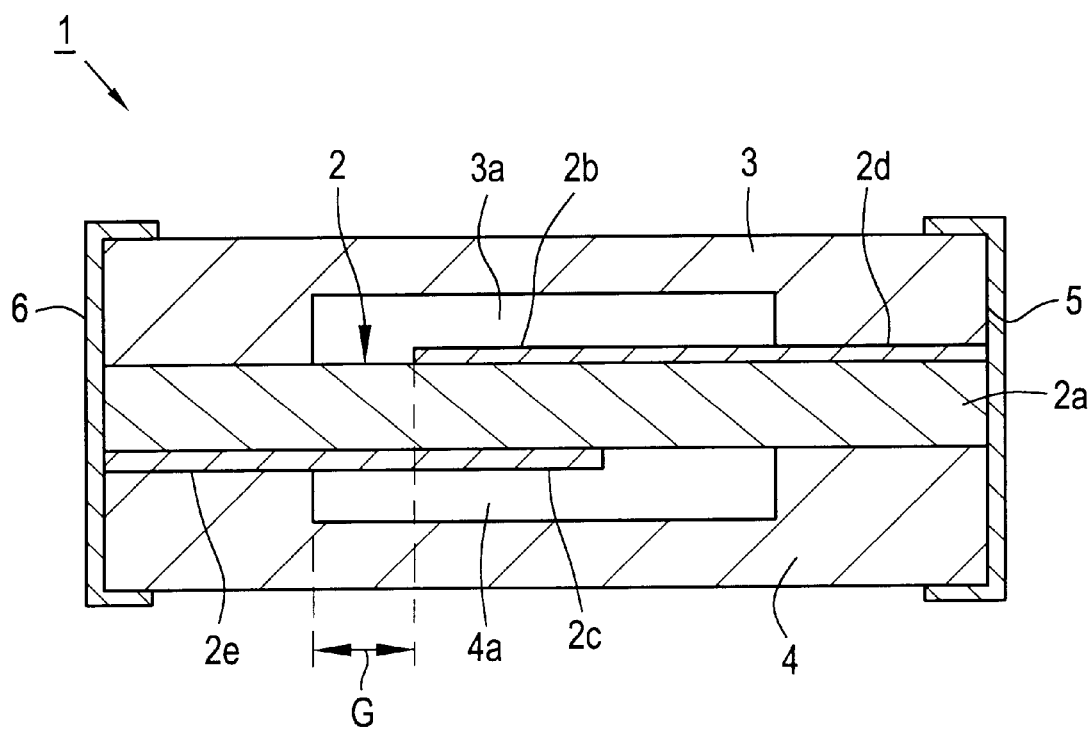
FIG. 1 is a vertical sectional view of a piezoelectric resonator according to a preferred embodiment of the present invention.
Figure 2:
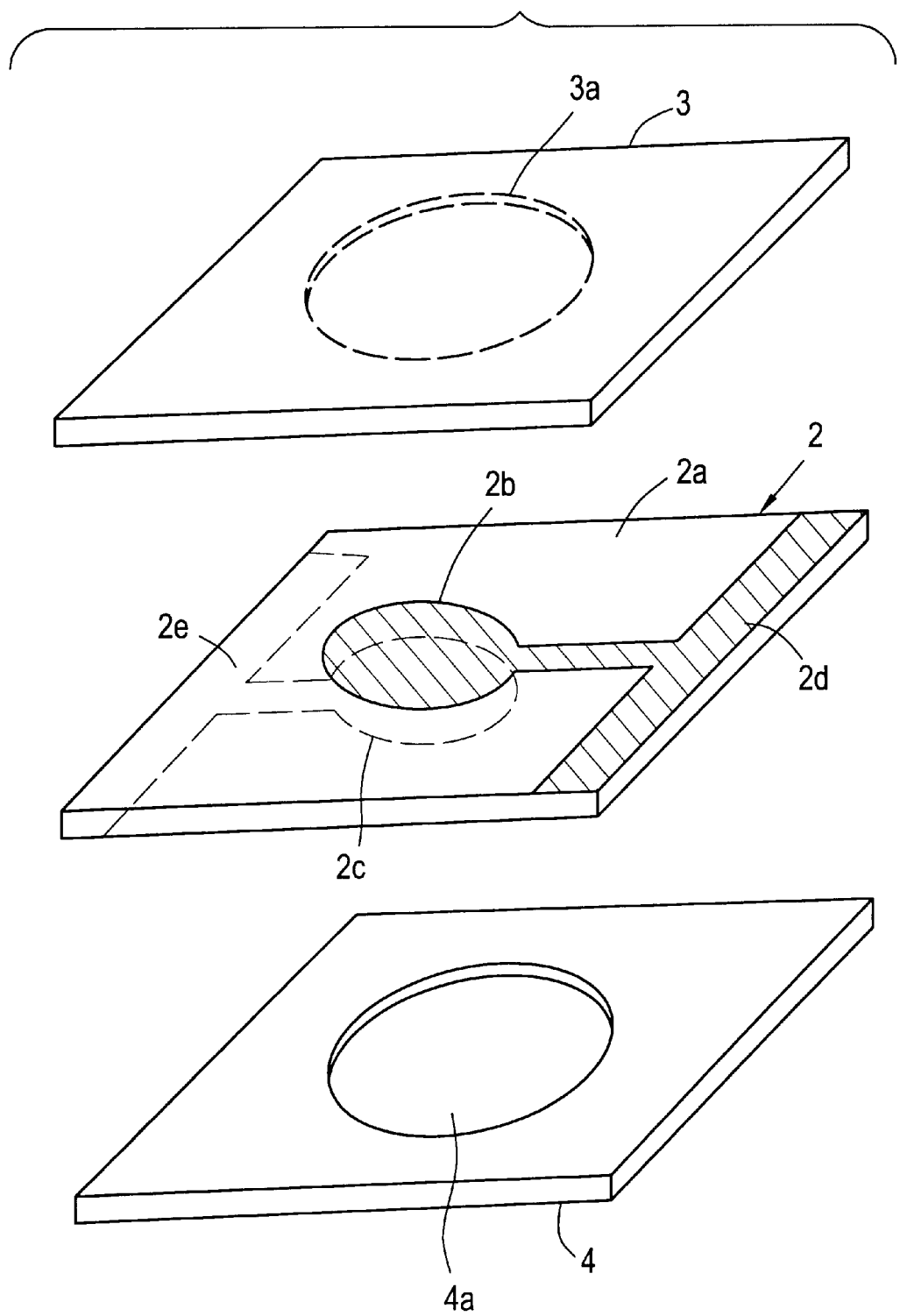
FIG. 2 is an exploded perspective view of the piezoelectric resonator of FIG. 1.

Referring to FIGS. 1 and 2, a piezoelectric resonator 1 includes an energy trap type piezoelectric resonance element 2 which preferably has a substantially rectangular block. The piezoelectric resonance element 2 is adapted to generate the third harmonic of a thickness extensional vibration mode.

The piezoelectric resonance element 2 includes a substantially rectangular piezoelectric substrate 2a. The piezoelectric resonance element 2a is made of a piezoelectric ceramic, such as a ceramic of lead zirconate titanate. However, the piezoelectric substrate 2a may be made of a piezoelectric material other than a piezoelectric ceramic, such as crystal, LiTaO$_3$, or a similar piezoelectric monocrystal.

A first excitation electrode 2b having a substantially circular shape is provided on the upper surface of the piezoelectric substrate 2a. A second excitation electrode 2c having a substantially circular shape is provided on the lower surface of the piezoelectric substrate 2a so as to face the first excitation electrode 2b. The excitation electrodes 2b and 2c may have any other shape, such as substantially rectangular, for example.

In the present preferred embodiment, the excitation electrodes 2b and 2c are displaced leftward from the center of the piezoelectric substrate 2a in FIG. 2.

The excitation electrodes 2b and 2c are electrically connected with lead electrodes 2d and 2e, respectively, which are formed on the upper and lower surfaces, respectively, of the piezoelectric substrate 2a. The lead electrodes 2d and 2e extend to the corresponding edges of the piezoelectric substrate 2a.

When an AC voltage is applied between the excitation electrodes 2b and 2c, a portion of the piezoelectric resonance element 2 sandwiched between the excitation electrodes 2b and 2c, i.e., a vibrating portion, is excited. Vibration energy associated with the excitation leaks out from the vibrating portion, however, since the vibrating portion is formed partially, the third harmonic of thickness extensional vibration is effectively trapped within the vibrating portion.

Notably, a portion of the excited vibration leaks out from the vibrating portion. As mentioned previously, leakage vibration, particularly, that of the fundamental harmonic causes spurious vibration. In the present preferred embodiment, therefore, a package structure is designed such that a seal portion damps leakage vibration of the fundamental harmonic.

The piezoelectric element 2 is sandwiched between first and second sealing substrates 3 and 4. Each of the sealing substrates 3 and 4 is preferably made of an insulating ceramic, such as alumina. However, the sealing substrates 3 and 4 may be made of any other insulating material, such as a synthetic resin.

A cavity 3a is provided in the lower surface of the sealing substrate 3 so as to define a vibration space of the vibrating portion. Similarly, a cavity 4a is formed in the upper surface of the sealing substrate 4.

A portion of the sealing substrate 3 located outside of the cavity 3a and a portion of the sealing substrate 4 located outside of the cavity 4a are bonded to the piezoelectric resonance element 2 via an insulating adhesive layer (not shown) (see FIGS. 1 and 2). The thus-bonded portions constitute the seal portions. Therefore, in FIG. 1, the regions outside the cavities serve as the sealing portions.

As shown in FIG. 1, external electrodes 5 and 6 are disposed on the opposite end surfaces of a laminate which includes the piezoelectric resonance element 2 and the sealing substrates 3 and 4. The external electrode 5 is connected with the lead electrode 2d, and the external electrode 6 is connected with the lead electrode 2e.

As seen from FIG. 1, the cavities 3a and 4a define a space for vibration of the vibrating portion. The cavities 3a and 4a are not displaced relative to each other as viewed along the major surface of the piezoelectric resonance element 2. In other words, the cavities 3a and 4a are aligned with each other in the direction of the thickness of the piezoelectric resonance element 2. Insulating substrates of the same kind, each having a cavity provided therein, may be used as members for the sealing substrates 3 and 4, so that the cost of dies can be reduced and the manufacturing process becomes easy to perform.

In the piezoelectric resonator 1 of the present preferred embodiment, an AC voltage is applied between the excitation electrodes 2b and 2c via the external electrodes 5 and 6 so as to excite the vibrating portion, thereby yielding a resonant characteristic of the vibrating portion through utilization of the third harmonic of a thickness extensional vibration mode. The fundamental harmonic, which might cause significant spurious vibration, leaks out from the vibrating portion. Vibration energy of the leaking fundamental harmonic is damped by the seal portion. As described previously, the seal portion includes the bonded portion between the piezoelectric resonance element 2 and the sealing substrates 3 and 4.

As in the case of the present preferred embodiment, when the excitation electrodes 2b and 2c have a substantially circular shape, a region of leakage vibration of the fundamental harmonic concentrically surrounds the excitation electrodes 2b and 2c. If the vibrating portion is located at the center of the vibration space defined by the cavities 3a and 4a, leakage vibration of the fundamental harmonic may not be damped by the seal portion.

In the present preferred embodiment, since the vibrating portion is displaced from the center of the space as viewed along the major surface of the piezoelectric resonance element 2, the region of leakage vibration of the fundamental harmonic reaches the seal portion, so that leakage vibration of the fundamental harmonic is effectively damped.

Specifically, as shown in FIG. 1, the vibrating portion is displaced leftward from the center of the space defined by the cavities 3a and 4a. Accordingly, vibration of the fundamental harmonic leaking out from the vibrating portion is effectively damped by the seal portion, particularly by a region of the seal portion located at the left of FIG. 1. Thus, the fundamental harmonic which cause spurious vibration can be more effectively suppressed as compared to a structure in which the cavities 3a and 4a are located at the center of the vibration space.

In the chip-type piezoelectric resonator 1 of the present preferred embodiment, through adjustment of the displacement of the vibrating portion as viewed along the major surface of the piezoelectric resonance element 2, leakage vibration of the fundamental harmonic, which might otherwise cause significant spurious vibration, can be effectively suppressed with no substantial effect on a resonance characteristic produced by the third harmonic of thickness extensional vibration.

In the present preferred embodiment, the vibrating portion is displaced leftward in FIG. 1, i.e., toward the external electrode 6, within the vibration space defined by the cavities 3a and 4a. However, the direction in which the vibrating portion is displaced as viewed along the major surface of the piezoelectric resonance element 2 is not particularly limited. For example, as shown in FIGS. 3A to 3C, the vibrating portion may be displaced in any direction as viewed along the major surface. FIGS. 3A to 3C are schematic plan views showing the relative position among the seal portion, the space, and the vibrating portion. In FIGS. 3A to 3C, reference numeral 7 denotes the seal portion; reference numeral 8 denotes the vibration space; solid line A denotes an outer edge of the seal portion; solid line B denotes an inner edge of the seal portion; circle C denotes the vibrating portion; and dashed line D denotes the vibrating portion located at the center of the vibration space.

In the piezoelectric resonator 1 of FIG. 1, the vibration space defined by the cavities 3a and 4a has a substantially circular shape as viewed in a plan view thereof. However, in FIGS. 3A to 3C, the vibration space 8 has a substantially rectangular shape as viewed in a plan view thereof. The shape of the space as viewed in a plan view thereof is not limited to a substantially circular one, but may assume a variety of forms, such as substantially rectangular.

Figure 4C:
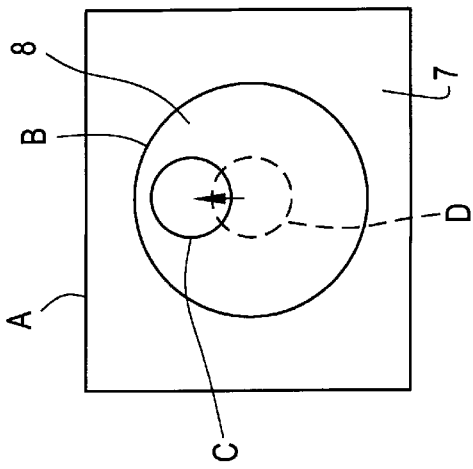
FIG. 4C is a plan view showing the positional relation among the seal portion, the space, and the vibrating portion in a still further modified example of the piezoelectric resonator of FIG. 1.
Figure 4B:
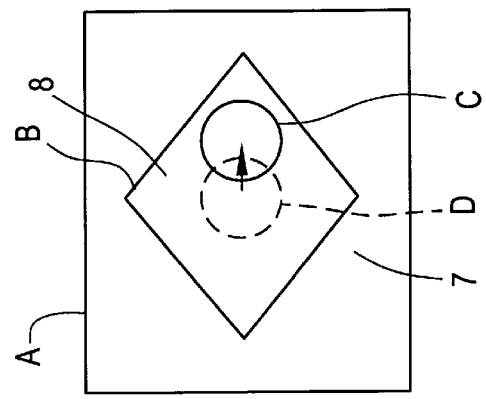
FIG. 4B is a plan view showing the positional relation among the seal portion, the space, and the vibrating portion in a still further modified example of the piezoelectric resonator of FIG. 1.
Figure 4A:
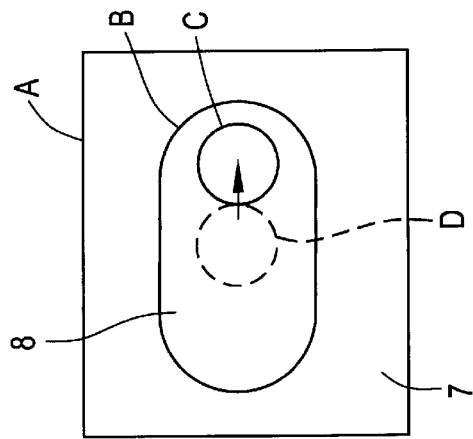
FIG. 4A is a plan view showing the positional relation among the seal portion, the space, and the vibrating portion in a still further modified example of the piezoelectric resonator of FIG. 1.

FIGS. 4A to 4C show examples of the shape of the vibration space.

In FIG. 4A, the shape of the vibration space 8 as viewed in a plan view thereof is substantially circular as in the case of the piezoelectric resonator 1, and the center of the vibrating portion C is displaced from the center of the vibration space 8. In FIG. 4B, the shape of the vibration space 8 as viewed in a plan view thereof is a substantially diamond shape. In FIG. 4C, the shape of the vibration space 8 as viewed in a plan view thereof is a substantially elongated ellipse.

Figure 5:
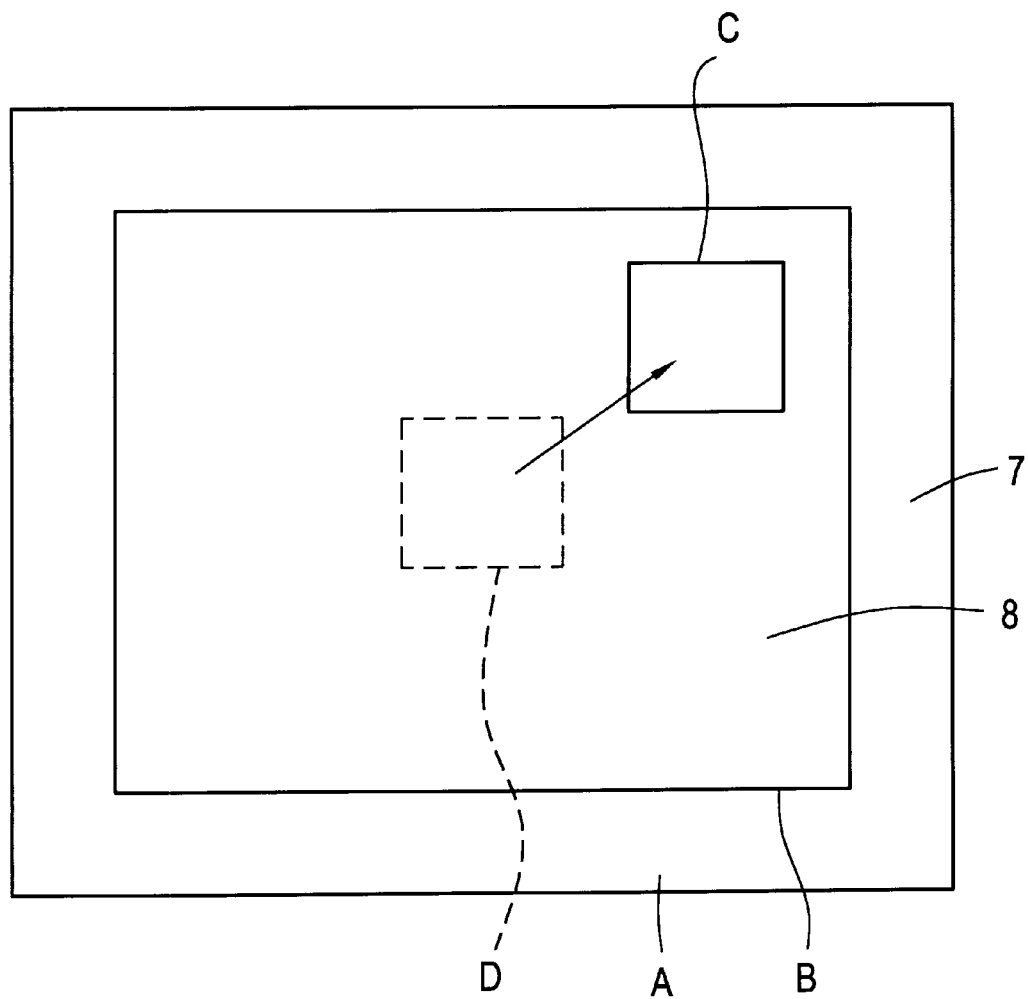
FIG. 5 is a plan view showing the positional relation between a vibrating portion having a substantially rectangular shape as viewed on a plan view thereof and a space having a substantially rectangular shape in a still further modified example of the piezoelectric resonator of FIG. 1.

As shown in a schematic plan view of FIG. 5, the shape of the vibrating portion C as viewed in a plan view thereof is not limited to a substantially circular one, but may be substantially rectangular. In FIG. 5, the substantially rectangular vibrating portion C is diagonally displaced from the center of the space B having a substantially rectangular shape as viewed in a plan view thereof.

Figure 6A:
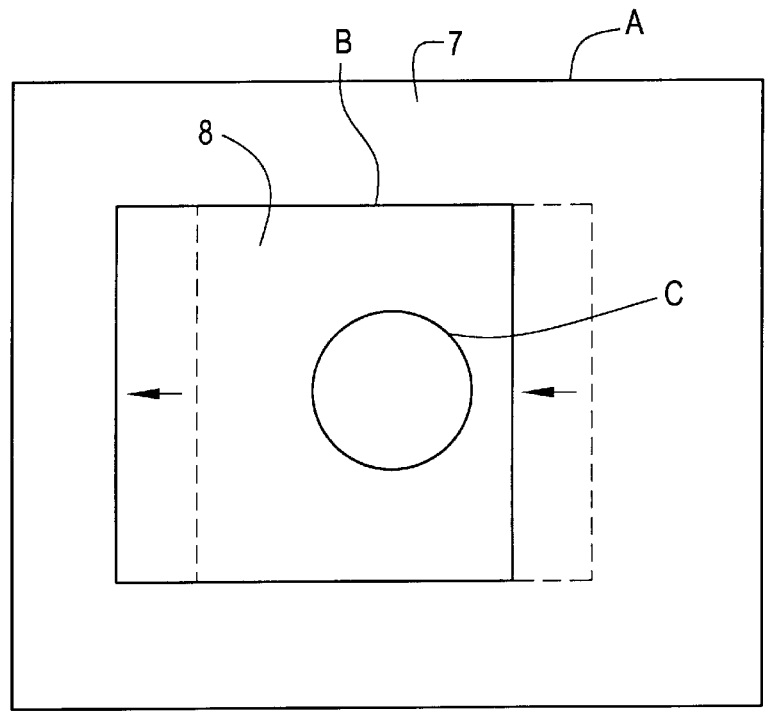
FIG. 6A is a schematic plan view of a still further modified example of the piezoelectric resonator of FIG. 1.
Figure 6B:
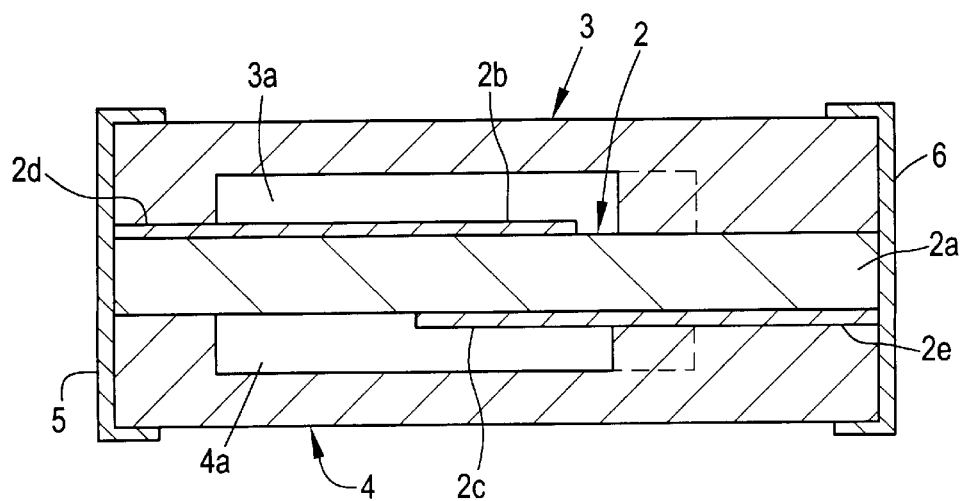
FIG. 6B is a vertical sectional view of the piezoelectric resonator of FIG. 6A.

In the chip-type piezoelectric resonator 1 of the first preferred embodiment, the cavities 3a and 4a are arranged such that the center of the space defined by the cavities 3a and 4a is aligned with that of the piezoelectric resonance element 2 as viewed in a plan view of the piezoelectric resonator 1. However, the vibration space may be arranged such that the center thereof is displaced from that of the piezoelectric resonance element 2 as viewed along the major surface of the piezoelectric resonance element 2. FIGS. 6A and 6B show an example of such displacement of the vibration space.

As indicated by the arrows of FIG. 6A, the vibration space 8 is displaced leftward from a position represented by a dashed line. In other words, as shown in FIG. 6B, the cavities 3a and 4a formed in the sealing substrates 3 and 4, respectively, are displaced leftward from the geometric center of the piezoelectric resonance element 2.

By contrast, the vibrating portion sandwiched between the excitation electrodes 2b and 2c is preferably located at the approximate geometric center of the piezoelectric resonance element 2 in FIG. 6B. As a result, the vibrating portion is displaced relative to each other rightward in relation to the center of the vibration space 8.

As described above, in the present invention, if the vibrating portion is displaced from the center of the space as viewed in a plan view of the piezoelectric resonator, either the vibration space or the vibrating portion or both may be displaced from the center of the piezoelectric resonance element as viewed in a plan view of the piezoelectric resonator.

Even in the preferred embodiment of FIG. 6, since the sealing substrates 3 and 4 can be made of substrate of the same kind, the cost of dies is significantly reduced, and the manufacturing processes are greatly simplified, as in the case of the piezoelectric resonator 1 of FIG. 1.

Next will be described examples of the chip-type piezoelectric resonator according to preferred embodiments of the present invention with the intention of demonstrating that the fundamental harmonic is effectively suppressed through the relative displacement between the vibration space and the vibrating portion as viewed along the major surface of the piezoelectric resonator.

For these examples, the chip-type piezoelectric resonators 1 of the following specifications were manufactured. The piezoelectric resonance element 2 was made of the piezoelectric substrate 2a measuring approximately 3.7 mm×3.1 mm×126 µm. The excitation electrodes 2b and 2c having a diameter of about 0.4 mm were provided on the corresponding opposite major surfaces of the piezoelectric substrate 2a in such a manner as to be displaced by a predetermined distance toward the seal portion located on the side of the external electrode 6 from the approximate geometric center of the piezoelectric substrate 2a. The distance of displacement was varied, yielding a variety of piezoelectric resonance elements 2.

The sealing substrates 3 and 4, each measuring approximately 3.7×3.1×0.4 mm, were bonded to the corresponding opposite surfaces of each piezoelectric resonance element 2 by use of an insulating adhesive. The sealing substrate 3 (4) was made of the aforementioned insulating substrate on one surface of which a rectangular cavity 3a (4a) measuring approximately 2.6×2.0 (×0.1) mm was formed at the center thereof.

After each piezoelectric resonance element 2 was sandwiched between the sealing substrates 3 and 4, the external electrodes 5 and 6 were disposed thereon. Thus, a variety of piezoelectric resonators were produced and measured for phase difference. The results are shown in FIGS. 7 and 8.

Figure 8:
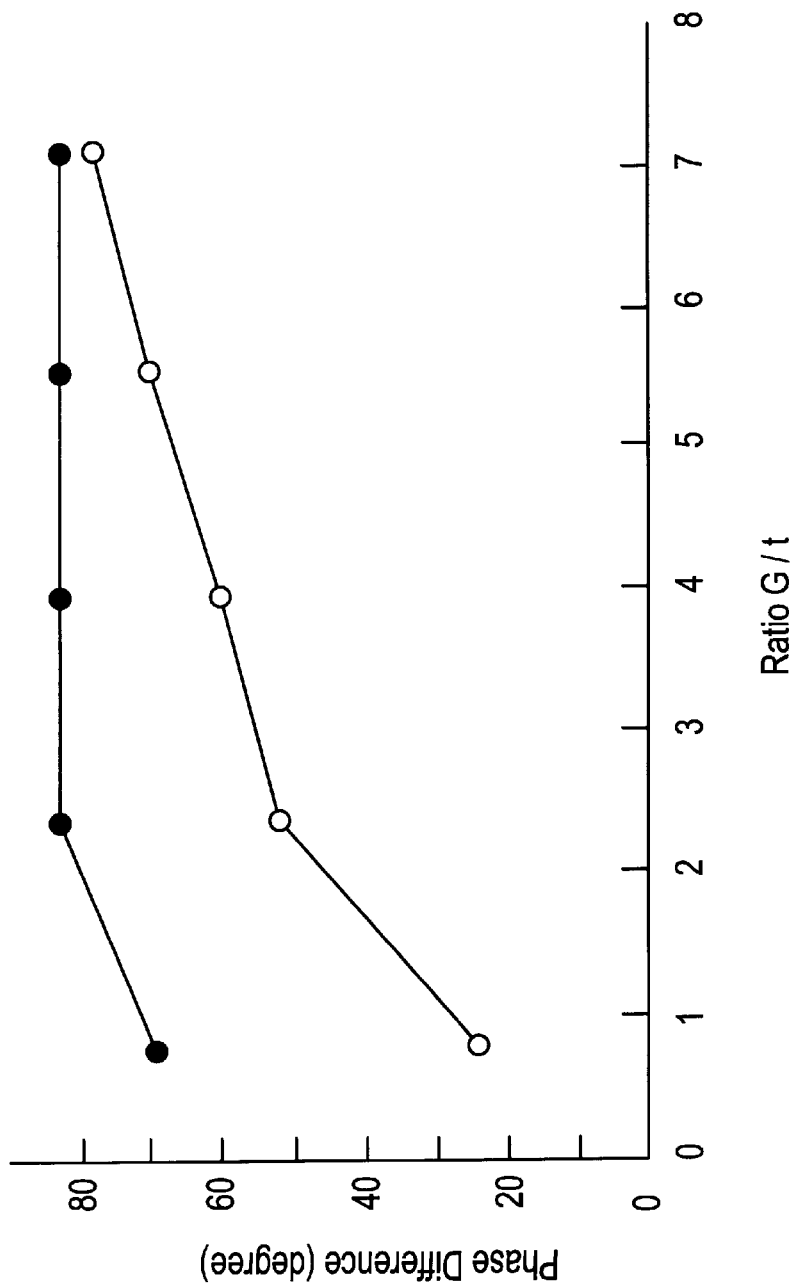
FIG. 8 is a graph showing the ratio G/t vs. the phase difference in the piezoelectric resonator of FIG. 1.
Figure 11:
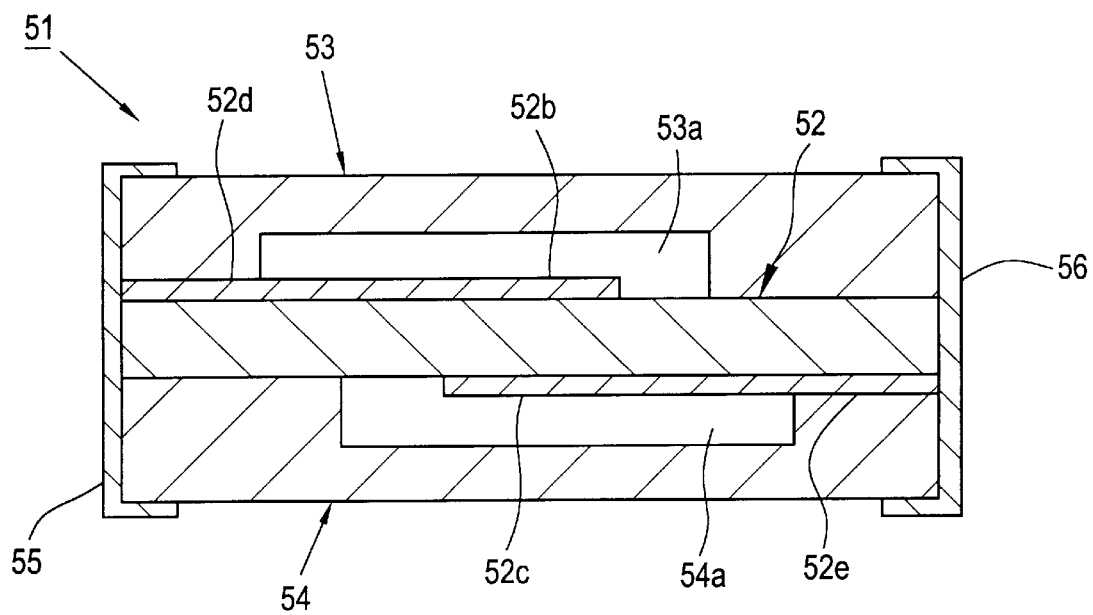
FIG. 11 is a vertical sectional view of the piezoelectric resonator of FIG. 10.

"Shortest distance to seal portion G" in FIGS. 7 and 8 denotes the distance between the vibrating portion and a region of the seal portion closest to the vibrating portion as shown in FIG. 3. A short side of the cavity 3a (4a) which has a substantially rectangular shape as viewed in a plan view thereof is about 20 mm long, and the vibrating portion has a diameter of about 0.4 mm; thus, when G=0.8 mm, the vibrating portion is located at the approximate center of the space as viewed in a plan view thereof.

In FIGS. 7 and 8, a white dot indicates the phase of the fundamental harmonic, and a black dot indicates the phase of the third harmonic of thickness extensional vibration.

As seen from FIG. 7, as the shortest distance G between the vibrating portion and the seal portion decreases, i.e., as the displacement of the vibrating portion from the approximate center of the piezoelectric resonance element as viewed along the major surface of the element increases, the fundamental harmonic can be suppressed more effectively.

When the shortest distance G to the seal portion is about 0.3 mm, the phase of the fundamental harmonic becomes approximately 50 degrees, indicating an improvement of about 25 degrees as compared to the case of G=0.9 mm.

As seen from FIG. 8, when the ratio of the shortest distance G to the thickness t of the piezoelectric resonance element, or G/t, is greater than 0 and is not greater than 5, the fundamental harmonic has a phase of not greater than 70 degrees, indicating that the fundamental harmonic can be effectively suppressed.

In the above-described preferred embodiments, the piezoelectric resonance element is sandwiched between the sealing substrates, and the cavity is formed in each sealing substrate such that the cavity opens onto the piezoelectric resonance element to thereby define the space for vibration. However, the present invention is not limited thereto. The chip-type piezoelectric resonator of the present invention may include a packaging structure using a capping member. A piezoelectric resonator including such a packaging structure is shown in FIG. 9.

In FIG. 9, a base substrate 21 is made of a substantially rectangular insulating substrate. A cavity 21a is formed in the upper surface of the base substrate 21. The cavity 21a is adapted to define a space to allow vibration of the vibrating portion.

A piezoelectric resonance element 2 is bonded onto the base substrate 21 via insulating adhesive layers 22 and 23, which serve as the seal portion. The piezoelectric resonance element 2 is configured in a manner similar to that of the piezoelectric resonance element 2 of FIG. 1.

A capping member 24 whose opening 24a faces downward in FIG. 9 is bonded onto the base substrate 21 by use of an insulating adhesive (not shown) so as to enclose the piezoelectric resonance element 2. The capping member 24 may be made of any appropriate material, such as metal or synthetic resin.

In the structure of FIG. 9, the insulating adhesive layers 22 and 23 serve as the seal portion and define the space for vibration. In this case, the vibrating portion may also be displaced from the approximate center of the space as viewed along the major surface of the piezoelectric resonance element 2 so that leakage vibration of the fundamental harmonic can be effectively suppressed in a manner similar to that of the chip-type piezoelectric resonator 1.

Specifically, when the vibrating portion is displaced rightward as shown in FIG. 9, the distance between the vibrating portion and the insulating adhesive layer 23 is shortened, so that leakage vibration of the fundamental harmonic can be effectively suppressed.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator comprising:

an energy trap piezoelectric resonance element adapted to vibrate in a third harmonic of thickness extensional vibration, the piezoelectric resonance element including a piezoelectric substrate and a pair of excitation electrodes respectively provided on a pair of major surfaces of the piezoelectric substrate opposed to each other so as to face each other with the piezoelectric substrate disposed therebetween, a portion of the piezoelectric substrate sandwiched by the excitation electrodes defining a vibrating portion;

a packaging member arranged to define a vibration space which encloses at least the vibrating portion so as to allow vibration of the vibrating portion, the vibrating portion being arranged such that the center thereof is displaced from the center of the vibration space as viewed along the major surface of the piezoelectric resonance element; and a seal portion provided around the vibration space so as to damp leakage vibration.

2. The piezoelectric resonator according to claim 1, wherein the packaging member includes first and second sealing substrates attached onto corresponding major surfaces of the piezoelectric resonance element, each of the first and second sealing substrates has a cavity provided in a side thereof in contact with the piezoelectric resonance element such that the cavities define the vibration space, each of the first and second sealing substrates is bonded to the piezoelectric resonance element at a portion surrounding the cavity; and the bonded portions define the seal portion.

3. The piezoelectric resonator according to claim 1, wherein the packaging member includes a base substrate and a capping member, the piezoelectric resonance element is bonded to a top surface of the base substrate such that vibration thereof is not hindered, the capping member has an opening provided therein and is bonded to the surface of the base substrate via a circumferential edge of the opening, and a portion through which the piezoelectric resonance element is bonded to the base substrate defines the seal portion.

4. The piezoelectric resonator according to claim 1, wherein, a thickness of the piezoelectric resonance element is represented by t, and a shortest distance between the vibrating portion and the seal portion is represented by G, t and G are determined so as to satisfy the relation $0<G/t\leq 5$.

5. The piezoelectric resonator according to claim 1, wherein the center of the vibration space is aligned with the center of the piezoelectric resonance element as viewed along the major surface of the piezoelectric resonance element.

6. A piezoelectric resonator according to claim 1, wherein the center of the vibration space is displaced from the center of the piezoelectric resonance element as viewed along the major surface of the piezoelectric resonance element.

7. The piezoelectric resonator according to claim 1, wherein the seal portion includes an adhesive layer.

8. The piezoelectric resonator according to claim 1, wherein the pair of excitation electrodes are substantially circular.

9. The piezoelectric resonator according to claim 1, wherein the pair of excitation electrodes are substantially rectangular.

10. The piezoelectric resonator according to claim 1, wherein the vibration space has a substantially circular shape.

11. The piezoelectric resonator according to claim 1, wherein the vibration space has a substantially rectangular shape.

12. The piezoelectric resonator according to claim 1, wherein the vibration space has a substantially diamond shape.

13. The piezoelectric resonator according to claim 1, wherein the vibration space has a substantially elongated ellipse shape.

14. A method of damping the fundamental harmonic of a thickness extensional vibration generated by a piezoelectric resonator, the method comprising the steps of:

providing a piezoelectric resonator which includes an energy trap type piezoelectric resonance element adapted to vibrate in the third harmonic of a thickness extensional vibration mode, the piezoelectric resonance element including a piezoelectric substrate and a pair of excitation electrodes respectively provided on a pair of major surfaces of the piezoelectric substrate opposed to each other so as to face each other with the piezoelectric substrate disposed therebetween, a portion of the piezoelectric substrate sandwiched by the excitation electrodes defining a vibrating portion, a packaging member arranged to define a vibration space which encloses at least the vibrating portion so as to allow vibration of the vibrating portion, and a seal portion provided to surround the vibration space so as to damp leakage vibration; and displacing the center of the vibrating portion from the center of the vibration space as viewed along the major surface of the piezoelectric resonance element.

15. The method according to claim 14, wherein the packaging member includes first and second sealing substrates attached onto corresponding major surfaces of the piezoelectric resonance element, each of the first and second sealing substrates has a cavity provided in a side thereof in contact with the piezoelectric resonance element such that the cavities define the vibration space, each of the first and second sealing substrates is bonded to the piezoelectric resonance element at a portion surrounding the cavity; and the bonded portions define the seal portion.

16. The method according to claim 14, wherein the packaging member includes a base substrate and a capping member, the piezoelectric resonance element is bonded to a top surface of the base substrate such that vibration thereof is not hindered, the capping member has an opening provided therein and is bonded to the surface of the base substrate via a circumferential edge of the opening, and a portion through which the piezoelectric resonance element is bonded to the base substrate defines the seal portion.

17. The method according to claim 14, wherein, a thickness of the piezoelectric resonance element is represented by t, and a shortest distance between the vibrating portion and the seal portion is represented by G, t and G are determined so as to satisfy the relation $0<G/t\leq 5$.

18. The method according to claim 14, wherein the center of the vibration space is aligned with the center of the piezoelectric resonance element as viewed along the major surface of the piezoelectric resonance element.

19. A method according to claim 14, wherein the center of the vibration space is displaced from the center of the piezoelectric resonance element as viewed along the major surface of the piezoelectric resonance element.

20. A method according to claim 14, wherein the seal portion includes an adhesive layer.

* * * * *